(12) United States Patent
Wang

(10) Patent No.: US 8,258,842 B2
(45) Date of Patent: Sep. 4, 2012

(54) DEAD-TIME DETECTING CIRCUIT FOR INDUCTIVE LOAD AND MODULATION CIRCUIT USING THE SAME

(75) Inventor: Wei Wang, Taipei County (TW)

(73) Assignee: Princeton Technology Corporation, Xindian Dist., New Taipei (TW)

( * ) Notice: Subject to any disclaimer, the term of this patent is extended or adjusted under 35 U.S.C. 154(b) by 247 days.

(21) Appl. No.: 12/792,741

(22) Filed: Jun. 3, 2010

(65) Prior Publication Data
US 2010/0308869 A1 Dec. 9, 2010

(30) Foreign Application Priority Data
Jun. 4, 2009 (TW) .............................. 98118555 A

(51) Int. Cl.
*H03K 3/017* (2006.01)

(52) U.S. Cl. ....................................... 327/177; 327/113

(58) Field of Classification Search .................. 327/113, 327/114, 172–177
See application file for complete search history.

(56) References Cited

U.S. PATENT DOCUMENTS

| 5,929,665 A * | 7/1999 | Ichikawa et al. ............... 327/109 |
| 6,294,954 B1 * | 9/2001 | Melanson ........................ 330/10 |
| 7,098,640 B2 * | 8/2006 | Brown ........................... 323/283 |
| 7,126,304 B2 * | 10/2006 | Suzuki ...................... 318/400.04 |
| 2005/0184716 A1 * | 8/2005 | Brown ........................... 323/283 |
| 2011/0012577 A1 * | 1/2011 | Wang et al. .................... 323/283 |

* cited by examiner

*Primary Examiner* — Lincoln Donovan
*Assistant Examiner* — William Hernandez
(74) *Attorney, Agent, or Firm* — Winston Hsu; Scott Margo

(57) ABSTRACT

Dead-time detector includes an N-type power switch and a resistor. The N-type power switch includes a first end coupled to the output end of the output-stage circuit for receiving an output voltage, a second end for outputting a dead-time detecting signal, and a control end for receiving a gate-controlling voltage. The resistor is coupled between the second end of the N-type power switch and a voltage source providing a high voltage for keeping the voltage of the dead-time detecting signal when the N-type power switch does not output the dead-time detecting signal representing "ON". When the output voltage is so lower than the gate-controlling voltage that the N-type power switch is turned on, the N-type power switch outputs the dead-time detecting signal representing "ON". When the dead-time detecting signal represents "ON", the output-stage circuit leaves the dead-time state.

19 Claims, 3 Drawing Sheets

DEAD-TIME DETECTING CIRCUIT FOR INDUCTIVE LOAD AND MODULATION CIRCUIT USING THE SAME

BACKGROUND OF THE INVENTION

1. Field of the Invention

The present invention relates to a dead-time detecting circuit and the modulation circuit using the same, and more particularly, to a dead-time detecting circuit for inductive load and the modulation circuit using the same, wherein the detecting circuit is utilized for detecting the dead-time of the Pulse Width Modulation/Pulse Frequency Modulation (PWM/PFM) circuit.

2. Description of the Prior Art

In the PWM/PFM circuit, controlling the dead-time is very important. In the prior art, the dead-time generator is composed only of logic gates so that the generated dead-time is easily affected by the fabrication or the temperature. If the generated dead-time is too short, then the power switches of the output-stage circuit of the PWM/PFM circuit may be simultaneously turned on, generating the large current, causing the power switches overheated and even broken-down. If the generated dead-time is too long, the efficiency of the PWM/PFM circuit is reduced. Therefore, in design for the PWM/PFM circuit, the dead-time has to be properly designed and steadily controlled.

SUMMARY OF THE INVENTION

The present invention provides a dead-time detecting circuit. The dead-time detecting circuit is coupled between an output-stage circuit and a previous-stage circuit. The dead-time detecting circuit is utilized for detecting dead-time of the output-stage circuit. An output end of the output-stage circuit is coupled to an inductive load. A first resistor of the dead-time detecting circuit is coupled between a first voltage source and a second end of a first transistor of the dead-time detecting circuit. A first end of the first transistor is coupled to the output end of the output-stage circuit for receiving an output voltage of the output-stage circuit. A control end of the dead-time detecting circuit controls operation of the first transistor according to a controlling voltage. When relation between the output voltage and the controlling voltage conforms to a predetermined relation, the second end of the first transistor outputs a dead-time detecting signal representing turning on to the previous-stage circuit for the previous-stage circuit urging the output-stage circuit to leave a dead-time state.

The present invention further provides a dead-time detecting circuit. The dead-time detecting circuit is coupled between an output-stage circuit and a previous-stage circuit. The dead-time detecting circuit is utilized for detecting a dead-time of the output-stage circuit. The output-stage circuit is coupled to an inductive load. The dead-time detecting circuit comprises a first dead-time detector, and a second dead-time detector. The first dead-time detector is coupled between a first voltage source and an output end of the output-stage circuit. The first dead-time detector is utilized for outputting a first dead-time detecting signal according to a first predetermined relation. The second dead-time detector is coupled between a second voltage source and the output end of the output-stage circuit. The second dead-time detector is utilized for outputting a second dead-time detecting signal according to a second predetermined relation. When the first dead-time detecting signal or the second dead-time detecting signal represents turning on, the output-stage circuit leaves a dead-time state. The first voltage source is a high voltage source, and the second voltage source is a low voltage source.

The present invention further provides a modulation circuit of detecting dead-time. The modulation circuit of detecting dead-time comprises an output-stage circuit, a previous-stage circuit, and a dead-time detecting circuit. The output-stage circuit is utilized for providing an output signal to an inductive load. The previous-stage circuit is coupled to the output-stage circuit. The previous-stage circuit is utilized for providing a switch-driving signal to the output-stage circuit so as to control operation of the output-stage circuit. The dead-time detecting circuit is coupled between the previous-stage circuit and the output-stage circuit. The dead-time detecting circuit is utilized for detecting a dead-time of the output-stage circuit. The dead-time detecting circuit outputs a dead-time detecting signal to the previous-stage circuit according to a predetermined relation. The previous-stage circuit urges the output-stage circuit to leave a dead-time state according to the dead-time detecting signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
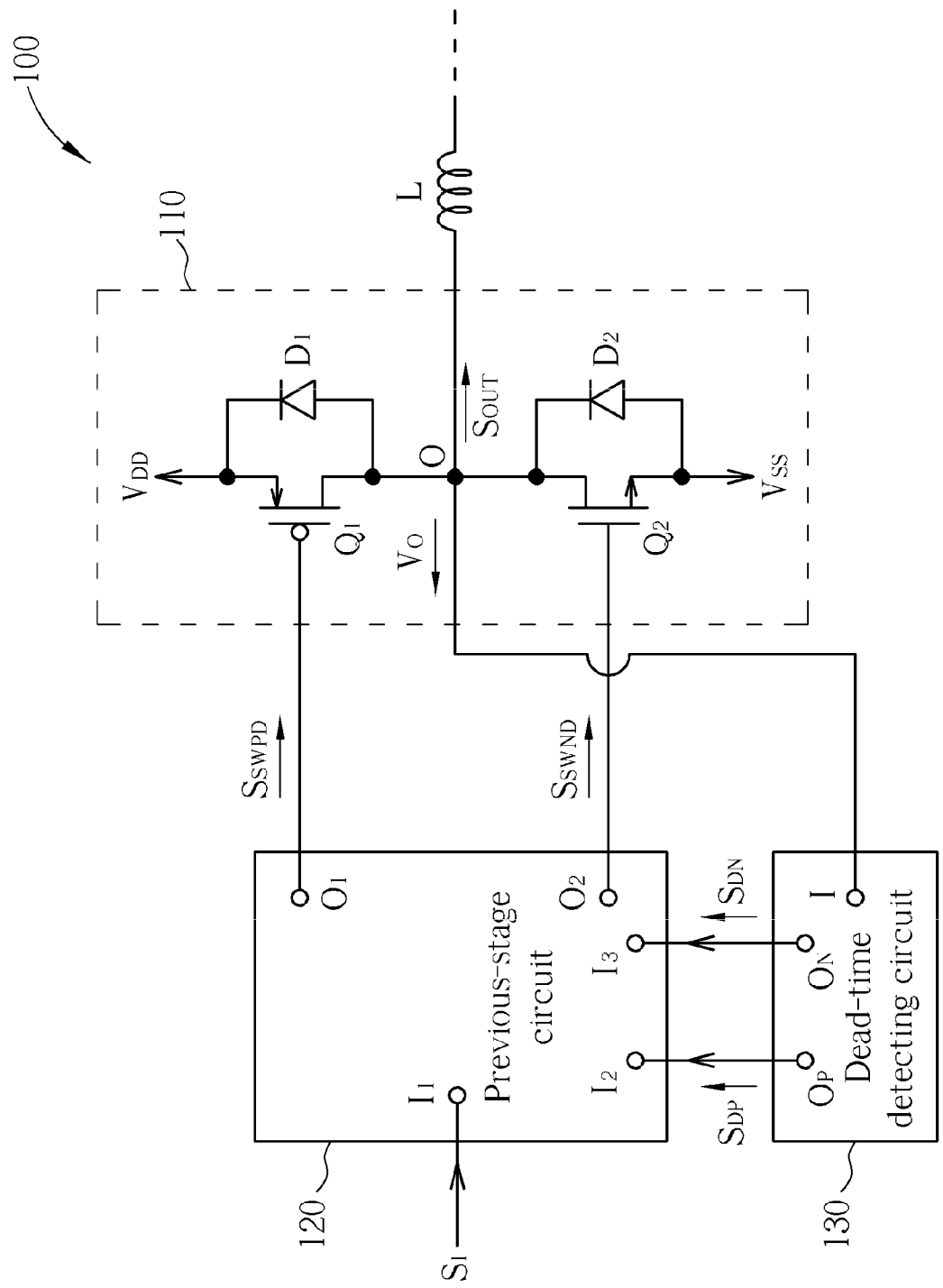
FIG. 1 is a diagram illustrating a PWM/PFM circuit of the present invention.

Please refer to FIG. 1. FIG. 1 is a diagram illustrating a PWM/PFM circuit 100 of the present invention. The PWM/PFM circuit 100 is utilized for converting an input signal $S_I$ into an output signal $S_{OUT}$, and providing the output signal $S_{OUT}$ to an inductive load L. The PWM/PFM circuit 100 comprises an output-stage circuit 110, a previous-stage circuit 120, and a dead-time detecting circuit 130.

The previous-stage circuit 120 comprises input ends $I_1$, $I_2$, and $I_3$, and output ends $O_1$, and $O_2$. The input ends $I_1$, $I_2$, and $I_3$ of the previous-stage circuit 120 receives the input signal $S_I$, dead-time detecting signals $S_{DP}$, and $S_{DN}$, respectively. The output ends $O_1$, and $O_2$ of the previous-stage circuit 120 respectively generates switch-driving signals $S_{SWPD}$ and $S_{SWPN}$ according to the input signal $S_I$, and the dead-time detecting signals $S_{DP}$, and $S_{DN}$. More particularly, the previous-stage circuit 120 generates the switch-driving signals $S_{SWPD}$ and $S_{SWND}$ according to the input signal $S_I$, respectively. For avoiding the power switches $Q_1$ and $Q_2$ of the output-stage circuit 110 being turned on at the same time, the previous-stage circuit 120 generates the switch-driving signals $S_{SWPD}$ and $S_{SWND}$ both representing "OFF" for a predetermined period so as to turn off the power switches of the output-stage circuit 110, causing the output-stage circuit 110 to enter the "dead-time" state. However, when the output-stage circuit 110 is in the "dead-time" state, if the previous-stage circuit 120 receives the dead-time detecting signal $S_{DP}$/$S_{DN}$ representing "ON", the previous-stage circuit 120 accordingly changes the switch-driving signal $S_{SWPD}$/$S_{SWNDN}$ from representing "OFF" to representing "ON" so that the output-stage circuit 110 leaves the "dead-time" state.

The output-stage circuit 110 comprises a P type power switch $Q_1$ and an N-type power switch $Q_2$. In a preferred embodiment, the P-type power switch $Q_1$ can be realized with a P-channel Metal Oxide Semiconductor (PMOS) transistor, and the N-type power switch $Q_2$ can be realized with an N channel Metal Oxide Semiconductor (NMOS) transistor.

The first end (source) of the P-type power switch $Q_1$ is coupled to a voltage source $V_{DD}$; the second end (drain) of the P-type power switch $Q_1$ is coupled to an output end O of the PWM/PFM circuit 100 (one end of the inductive load L); the control end (gate) of the P-type power switch $Q_1$ is coupled to the output end $O_1$ of the previous-stage circuit 120, for receiving the switch-driving signal $S_{SWPD}$. When the switch-driving signal $S_{SWPD}$ represents "ON", the P-type power switch $Q_1$ is turned on so that the voltage $V_{DD}$ provided by the voltage source $V_{DD}$ can be transmitted to the output end O of the PWM/PFM circuit 100; when the switch-driving signal $S_{SWPD}$ represents "OFF", the P-type power switch $Q_1$ is turned off so that the voltage $V_{DD}$ can not be transmitted through the P-type power switch $Q_1$ to the output end O.

The first end (source) of the N-type power switch $Q_2$ is coupled to a voltage source $V_{SS}$; the second end (drain) of the N-type power switch $Q_2$ is coupled to the output end O of the PWM/PFM circuit 100; the control end (gate) of the N-type power switch $Q_2$ is coupled to the output end $O_2$ of the previous-stage circuit 120, for receiving the switch-driving signal $S_{SWPN}$. When the switch-driving signal $S_{SWPN}$ represents "ON", the N-type power switch $Q_2$ is turned on so that the voltage $V_{SS}$ (provided by the voltage source $V_{SS}$) can be transmitted to the output end O of the PWM/PFM circuit 100; when the switch-driving signal $S_{SWPN}$ represents "OFF", the N-type power switch $Q_2$ is turned off so that the voltage $V_{SS}$ can not be transmitted through the N-type power switch $Q_2$ to the output end O of the PWM/PFM circuit 100. In a preferred embodiment of the present invention, the voltage source $V_{DD}$ represents a voltage source providing the high voltage $V_{DD}$; the voltage source $V_{SS}$ represents a voltage source providing the low voltage $V_{SS}$ (for example, the ground).

In addition, the P-type power switch $Q_1$ has a parasitic diode $D_1$, which is coupled between the first end and the second end of the P-type power switch $Q_1$. The N-type power switch $Q_2$ has a parasitic diode $D_2$, which is coupled between the first end and the second end of the N-type power switch $Q_2$. Hence, when the output-stage circuit 110 is in the dead-time state (the power switches $Q_1$ and $Q_2$ are both turned off), if the inductive load L discharges current to the voltage source $V_{DD}$ through the parasitic diode $D_1$, the output voltage on the output end O is equal to $(V_{DD}+V_{D1})$, wherein $V_{D1}$ represents the forward voltage of the parasitic diode $D_1$. When the output-stage circuit 110 is in the dead-time state, if the inductive load L discharges current to the voltage source $V_{SS}$ through the parasitic diode $D_2$, the output voltage $V_O$ on the output end O is equal to $(V_{SS}-V_{D2})$, wherein $V_{D2}$ represents the forward voltage of the parasitic diode $D_2$.

The dead-time detecting circuit 130 comprises an input end I, and output ends $O_P$ and $O_N$. The input end I is coupled to the output end O of the PWM/PFM circuit 100, for receiving the output voltage $V_O$. The output end $O_P$ of the dead-time detecting circuit 130 is coupled to the input end $I_2$ of the previous-stage circuit 120, for transmitting the dead-time detecting signal $S_{DP}$; The output end $O_N$ of the dead-time detecting circuit 130 is coupled to the input end $I_3$ of the previous-stage circuit 120, for transmitting the dead-time detecting signal $S_{DN}$. As a result, the dead-time detecting circuit 130 can determine if the output-stage circuit 110 is in the dead-time state and if the inductive load L discharges current to the voltage sources $V_{DD}$ or $V_{SS}$ according to the output voltage $V_O$, and the dead-time detecting circuit 130 accordingly generates the dead-time detecting signals $S_{DP}$ or $S_{DN}$ representing "ON" to the previous-stage circuit 120 so as to turn on the power switches $Q_1$ or $Q_2$.

Figure 2:
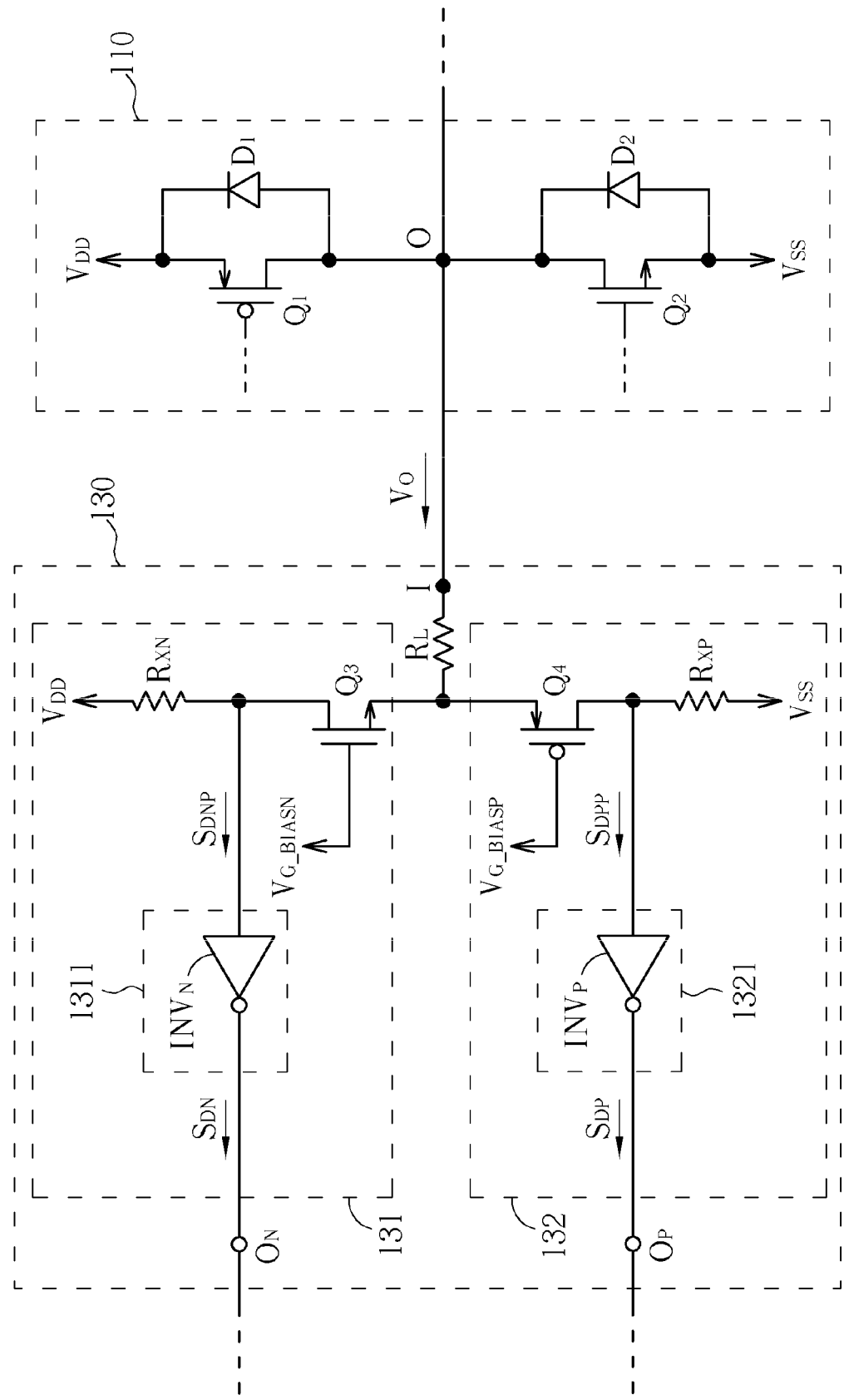
FIG. 2 is a diagram illustrating a dead-time detecting circuit of the present invention.

Please refer to FIG. 2. The dead-time detecting circuit 130 comprises an N-type dead-time detector 131, a P-type dead-time detector 132, and a current-limiting resistor $R_L$. The N-type dead-time detector 131 comprises an N-type transistor $Q_3$, a resistor $R_{XN}$, and a waveform trimmer 1311. The first end (source) of the N-type transistor $Q_3$ is coupled to the input end I of the dead-time detecting circuit 130 through the current-limiting resistor $R_L$, for receiving the output voltage $V_O$. The current-limiting resistor $R_L$ is utilized to avoid the inductive load L discharging too much current to the dead-time detecting circuit 130. The second end (drain) of the N-type transistor $Q_3$ is coupled to the resistor $R_{XN}$, for generating the previous-stage dead-time detecting signal $S_{DNP}$; the control end (gate) of the N-type transistor $Q_3$ is utilized for receiving a gate-controlling voltage $V_{G\_BIASN}$. The resistor $R_{XN}$ is coupled between the second end of the N-type transistor $Q_3$ and the voltage source $V_{DD}$. The waveform trimmer 1311 is coupled between the second end of the N-type transistor $Q_3$ and the output end $O_N$, for trimming the waveform of the previous-stage dead-time detecting signal $S_{DNP}$, and accordingly outputting the dead-time detecting signal $S_{DN}$. The waveform trimmer 1311 can be realized with an inverter $INV_N$. In addition, assuming that the voltage drop across the current-limiting resistor $R_L$, and the voltage drops across the power switches $Q_1$ and $Q_2$ can be ignored, the gate-controlling voltage $V_{G\_BIASN}$ can be designed as following formulas:

$$(V_{SS}+V_{T3}) > V_{G\_BIASN} > V_{T3}+(V_{SS}-V_{D2}) \quad (1); \text{ and}$$

$$V_{GS3} \geq [V_{T3}+(V_{SS}-V_{D2})-V_O];$$

wherein $V_O=V_{SS}-V_{D2}$, and $V_{T3}$ represents the threshold voltage of the N-type transistor $Q_3$; the operational principle of the N-type dead-time detector 131 is illustrated as below.

When the output voltage $V_O$ is not lowered to $(V_{SS}-V_{D2})$, it means that the output voltage $V_O$ is higher than $(V_{SS}-V_{D2})$. The gate-source voltage $V_{GS3}$ of the N-type transistor $Q_3$ is equal to $[V_{T3}+(V_{SS}-V_{D2})-V_O]$ at the time. Since the output voltage is not lowered to $(V_{SS}-V_{D2})$, the gate-source voltage $V_{GS3}$ is not higher than the threshold voltage $V_{T3}$ of the N-type transistor $Q_3$ at the time so that the N-type transistor $Q_3$ is turned off. In this way, the previous-stage dead-time detecting signal $S_{DNP}$ is pulled up to the high voltage level $V_{DD}$ by the voltage source $V_{DD}$ through the resistor $R_{XN}$; the inverter $INV_N$ outputs dead-time detecting signal $S_{DN}$ representing "OFF" by inverting the previous-stage dead-time detecting signal $S_{DNP}$, and the dead-time detecting signal $S_{DN}$ is at the low voltage level at the time.

When the output voltage $V_O$ is lowered to $(V_{SS}-V_{D2})$, it means that the output voltage $V_O$ is equal to the voltage $(V_{SS}-V_{D2})$ or the output voltage $V_o$ is lower than the voltage $(V_{SS}-V_{D2})$, the output-stage circuit 110 is in the dead-time state (both the power switches $Q_1$ and $Q_2$ are turned off) and the inductive load L discharges through the voltage source $V_{SS}$. The voltage level of the gate-source voltage $V_{GS3}$ of the N-type transistor $Q_3$ is $[V_{T3}+(V_{SS}-V_{D2})-V_O]$ at the time. Since the output voltage is lowered to $(V_{SS}-V_{D2})$, the gate-source voltage $V_{GS3}$ is higher than the threshold voltage $V_{T3}$ of the N-type transistor $Q_3$ at the time so that the N-type transistor $Q_3$ is turned on. In this way, the previous-stage dead-time detecting signal $S_{DNP}$ is pulled down to the low voltage level through the N-type transistor $Q_3$; the inverter $INV_N$ outputs dead-time detecting signal $S_{DN}$ representing "ON" by inverting the previous-stage dead-time detecting signal $S_{DNP}$, and the dead-time detecting signal $S_{DN}$ is at the high voltage level so that the output-stage circuit 110 leaves the "dead-time" state. That is, the N-type dead-time detector 131 of the present invention can detect the status of the output-stage circuit 110 and the inductive load L so as to turn on the N-type power switch $Q_2$ of the output-stage circuit 110 in time when the output-stage circuit 110 is in the dead-time state and the inductive load L discharges through the voltage source $V_{SS}$. In this way, the dead-time of the output-stage circuit 110 is efficiently reduced, improving the efficiency of the PWM/PFM circuit 100.

The P-type dead-time detector 132 comprises a P-type transistor $Q_4$, a resistor $R_{XP}$, and a waveform trimmer 1321. The first end (source) of the P-type transistor $Q_4$ is coupled to the input end I of the dead-time detecting circuit 130 through the current-limiting resistor $R_L$, for receiving the output voltage $V_O$. The second end (drain) of the P-type transistor $Q_4$ is coupled to the resistor $R_{XP}$, for generating the previous-stage dead-time detecting signal $S_{DPP}$. The control end (gate) of the P-type transistor $Q_4$ is utilized for receiving a gate-controlling voltage $V_{G\_BIASP}$. The resistor $R_{XP}$ is coupled between the second end of the P-type transistor $Q_4$ and the voltage source $V_{SS}$. The waveform trimmer 1312 is coupled between the second end of the P-type transistor $Q_4$ and the output end $O_P$, for trimming the waveform of the previous-stage dead-time detecting signal $S_{DPP}$ so as to output the dead-time detecting signal $S_{DP}$. The waveform trimmer 1312 can be realized with an inverter $INV_P$. In addition, assuming that the voltage drop across the current-limiting resistor $R_L$, and the power switches $Q_1$ and $Q_2$ can be ignored, the gate-controlling voltage $V_{G\_BIASP}$ can be designed as following formulas:

$$V_{DD} - V_{T4} < V_{G\_BIASP} < V_{DD} - V_{T4} + V_{D1} \quad (2); \text{ and}$$

$$V_{SG4} \geq [V_O - (V_{DD} - V_{T4} + V_{D1})];$$

wherein $V_O = V_{DD} + V_{D1}$, and $V_{T4}$ represents the threshold voltage of the P-type transistor $Q_4$; the operational principle of the P-type dead-time detector 132 is illustrated as below.

When the output voltage $V_O$ is not raised up to $(V_{DD} + V_{D1})$, the gate-source voltage $V_{SG4}$ of the P-type transistor $Q_4$ is equal to $[V_O - (V_{DD} - V_{T4} + V_{D1})]$. Since the output voltage is not raised up to $(V_{DD} + V_{D1})$, the gate-source voltage $V_{SG4}$ is not higher than the threshold voltage $V_{T4}$ of the P-type transistor $Q_4$ at the time so that the P-type transistor $Q_4$ is turned off. In this way, the previous-stage dead-time detecting signal $S_{DPP}$ is pulled down to the low voltage level $V_{SS}$ by the voltage source $V_{SS}$ through the resistor $R_{XP}$; the inverter $INV_P$ outputs dead-time detecting signal $S_{DP}$ representing "OFF" by inverting the previous-stage dead-time detecting signal $S_{DPP}$, and the dead-time detecting signal $S_{DP}$ is at the high voltage level. When the output voltage $V_O$ is raised up to $(V_{DD} + V_{D1})$, that is, when the output voltage $V_O$ is equal to the voltage $(V_{DD} + V_{D1})$ or is higher than the voltage $(V_{DD} + V_{D1})$, the output-stage circuit 110 is in the dead-time state and the inductive load L discharges through the voltage source $V_{DD}$. Meanwhile, the voltage level of the gate-source voltage $V_{SG4}$ of the P-type transistor $Q_4$ is $[V_O - (V_{DD} - V_{T4} + V_{D1})]$. Since the output voltage is raised up to $(V_{DD} + V_{D1})$, the gate-source voltage $V_{GS4}$ is higher than the threshold voltage $V_{T4}$ of the P-type transistor $Q_4$ at the time so that the P-type transistor $Q_4$ is turned on. In this way, the previous-stage dead-time detecting signal $S_{DPP}$ is pulled up to the high voltage level through the P-type transistor $Q_4$; the inverter $INV_P$ outputs dead-time detecting signal $S_{DP}$ representing "ON" by inverting the previous-stage dead-time detecting signal SDPP, and the dead-time detecting signal $S_{DP}$ is at the low voltage level at the time so that the output-stage circuit 110 leaves the "dead-time" state. That is, the P-type dead-time detector 132 of the present invention can detect the status of the output-stage circuit 110 and the inductive load L so as to turn on the P-type power switch $Q_1$ of the output-stage circuit 110 in time when the output-stage circuit 110 is in the dead-time state and the inductive load L discharges through the voltage source $V_{DD}$. In this way, the dead-time is efficiently reduced, improving the efficiency of the PWM/PFM circuit 100.

In addition, in the embodiment of the present invention, the referred P-type transistor $Q_4$ can be realized with a PMOS transistor, and the referred N-type transistor $Q_3$ can be realized with an NMOS transistor.

Figure 3:
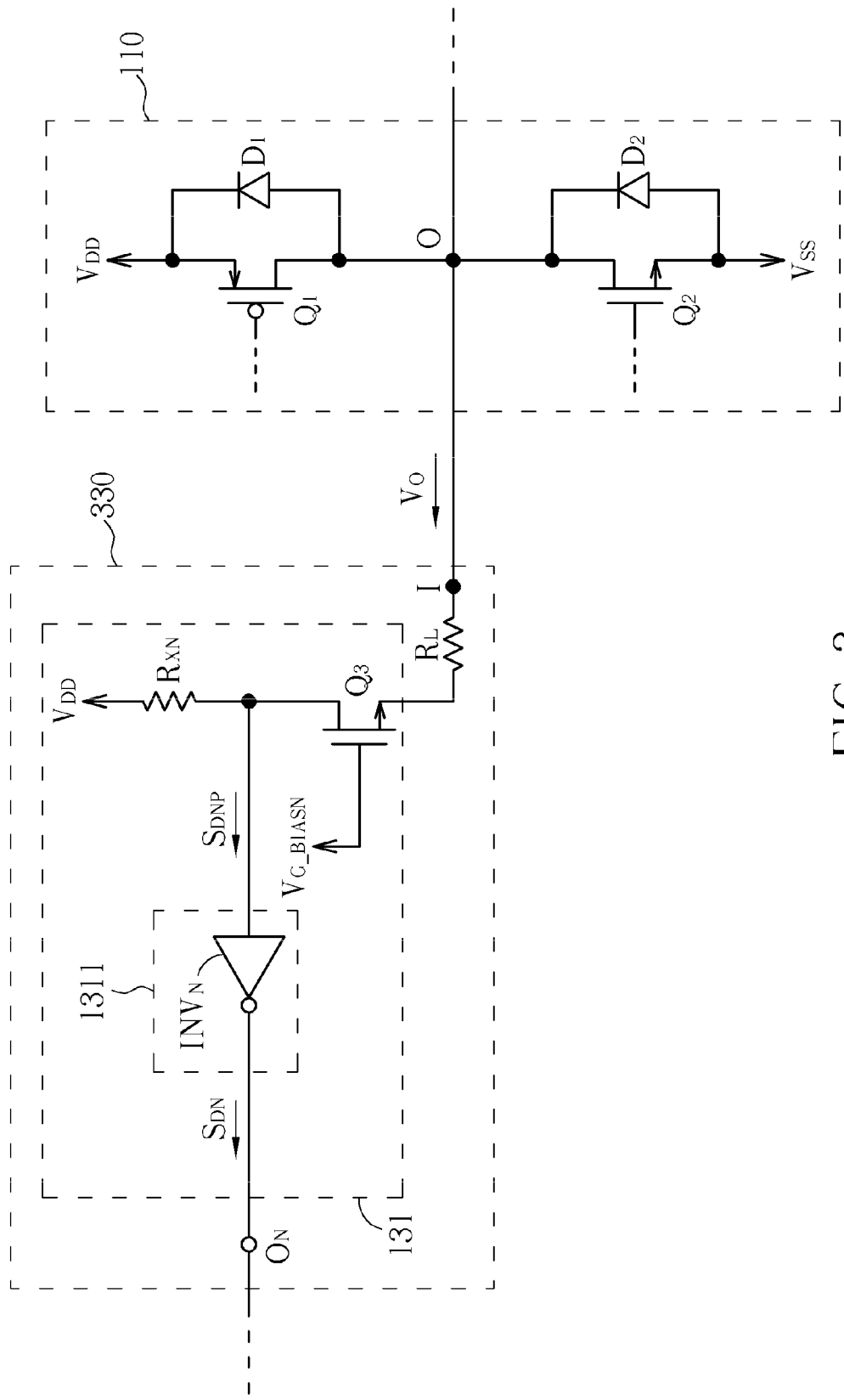
FIG. 3 is a diagram illustrating a dead-time detecting circuit realized with an N-type dead-time detector.

Although the P-type and the N-type dead-time detector are both used in the dead-time detecting circuit of the present invention, however, the user can use only one of the dead-time detectors for efficiently detecting the dead-time of the output-stage circuit, according to the requirement in the practical application. Please refer to FIG. 3. The dead-time detecting circuit 330 only includes an N-type dead-time detector 131. The operational principle of the dead-time detecting circuit 330 is similar to the above-mentioned and will not be repeated again for brevity.

In conclusion, the dead-time detecting circuit provided by the present invention can determine if an output-stage circuit is in the dead-time state according to the output voltage of the output-stage circuit, and the dead-time detecting circuit of the present invention can turn on the power switch of the output-stage circuit in time for output-stage circuit leaving the dead-time state. In this way, the dead-time of the output-stage circuit can be dynamically adjusted so that the power switch of the output-stage circuit can be turned on in time for avoiding the turned-on parasitic diode of the power switch causing large power consumption. Thus, the distortion of the output signal is reduced and the efficiency of the PWM/PFM circuit is improved at the same time, providing a great convenience.

Those skilled in the art will readily observe that numerous modifications and alterations of the device and method may be made while retaining the teachings of the invention.

What is claimed is:

1. A dead-time detecting circuit, coupled between an output-stage circuit and a previous-stage circuit, for detecting a dead-time of the output-stage circuit, an output end of the output-stage circuit coupled to an inductive load, a first resistor of the dead-time detecting circuit coupled between a first voltage source and a second end of a first transistor of the dead-time detecting circuit, a first end of the first transistor coupled to the output end of the output-stage circuit for receiving an output voltage of the output-stage circuit, a control end of the dead-time detecting circuit controlling operation of the first transistor according to a controlling voltage, wherein when relation between the output voltage and the controlling voltage conforms to a predetermined relation, the second end of the first transistor outputs a dead-time detecting signal representing turning on to the previous-stage circuit for the previous-stage circuit urging the output-stage circuit to leave a dead-time state.

2. The dead-time detecting circuit of the claim 1, wherein the output-stage circuit comprises:
   a first power switch, coupled between the first voltage source and the output end of the output-stage circuit; and
   a second power switch, coupled between a second voltage source and the output end of the output-stage circuit;
   wherein when both the first power switch and the second power switch are turned off, the output-stage circuit enters the dead-time state;
   wherein voltage level of the first voltage source is higher than voltage level of the second voltage source.

3. The dead-time detecting circuit of claim 2, wherein the first transistor is an N-channel Metal-Oxide-Semiconductor (NMOS) transistor; the first power switch is a P-channel Metal-Oxide-Semiconductor (PMOS) transistor; the second power switch is an NMOS transistor;

wherein when the output-stage circuit enters the dead-time state and the inductive load discharges through the second voltage source, the relation between the output voltage and the controlling voltage conforms to the predetermined relation; and wherein when the relation between the output voltage and the controlling voltage conforms to the predetermined relation, the first transistor outputs the dead-time detecting signal representing turning on for turning on the second power switch so that the output-stage circuit leaves the dead-time state.

4. The dead-time detecting circuit of claim 3, wherein the predetermined relation is:

$$(VSS+VT3) > VG\_BIASN > VT3+(VSS-VD2); \text{ and}$$

$$VGS3 \geq [VT3+(VSS-VD2)-VO];$$

wherein VO=VSS−VD2;
wherein VG_BIASN represents the controlling voltage; $V_O$ represents the output voltage; VT3 represents a threshold voltage of the first transistor; VSS represents a voltage provided by the second voltage source; VD3 represents a forward voltage of a parasitic diode of the second power switch.

5. The dead-time detecting circuit of claim 1, wherein the dead-time detecting circuit further comprises a waveform trimmer, coupled to the second end of the first transistor, for trimming waveform of the dead-time detecting signal;
wherein the waveform trimmer includes an inverter.

6. The dead-time detecting circuit of claim 1, further comprising a current-limiting resistor, coupled between the first end of the first transistor and the output end of the output-stage circuit, for avoiding discharged current of the inductive load entering the dead-time detecting circuit.

7. A dead-time detecting circuit, coupled between an output-stage circuit and a previous-stage circuit, for detecting a dead-time of the output-stage circuit, the output-stage circuit coupled to an inductive load, the dead-time detecting circuit comprising:
a first dead-time detector, coupled between a first voltage source and an output end of the output-stage circuit, for outputting a first dead-time detecting signal according to a first predetermined relation; and
a second dead-time detector, coupled between a second voltage source and the output end of the output-stage circuit, for outputting a second dead-time detecting signal according to a second predetermined relation;
wherein when the first dead-time detecting signal or the second dead-time detecting signal represents turning on, the output-stage circuit leaves a dead-time state;
wherein the first voltage source is a high voltage source, and the second voltage source is a low voltage source.

8. The dead-time detecting circuit of the claim 7, wherein the output-stage circuit comprises:
a first power switch, coupled between the first voltage source and the output end of the output-stage circuit; and
a second power switch, coupled between the second voltage source and the output end of the output-stage circuit;
wherein when the first power switch and the second power switch are both turned off, the output-stage circuit enters the dead-time state.

9. The dead-time detecting circuit of the claim 8, wherein the first dead-time detector comprises a first transistor and a first resistor; wherein the first resistor is coupled between a second end of the first transistor and the first voltage source; wherein a first end of the first transistor is coupled to the output end of the output-stage circuit, for receiving an output voltage of the output-stage circuit, the second end of the first transistor for outputting a first dead-time detecting signal, a control end of the first transistor for receiving a first controlling voltage; wherein when relation between the output voltage and the first controlling voltage confirms to the first predetermined relation, the first transistor outputs the first dead-time detecting signal representing turning on; and
wherein the second dead-time detector comprises a second transistor and a second resistor; wherein the second resistor is coupled between a second end of the second transistor and the second voltage source; wherein a first end of the second transistor is coupled to the output end of the output-stage circuit, for receiving the output voltage of the output-stage circuit, the second end of the second transistor for outputting a second dead-time detecting signal, a control end of the second transistor for receiving a second controlling voltage; wherein when relation between the output voltage and the second controlling voltage confirms to the second predetermined relation, the second transistor outputs the second dead-time detecting signal representing turning on.

10. The dead-time detecting circuit of claim 9, wherein the first power switch is a PMOS transistor, and the second power switch is an NMOS transistor;
Wherein the first transistor is an NMOS transistor, and the second transistor is a PMOS transistor;
wherein when the output-stage circuit enters the dead-time state and the inductive load discharges through the second voltage source, the relation between the output voltage and the first controlling voltage conforms to the first predetermined relation;
wherein when the relation between the output voltage and the first controlling voltage conforms to the first predetermined relation, the first transistor outputs the first dead-time detecting signal representing turning on for turning on the second power switch so that the output-stage circuit leaves the dead-time state.

11. The dead-time detecting circuit of claim 9, wherein the first predetermined relation is:

$$(VSS+VT3) > VG\_BIASN > VT3+(VSS-VD2); \text{ and}$$

$$VGS3 \geq [VT3+(VSS-VD2)-VO];$$

wherein VO=VSS−VD2;
wherein VG_BIASN represents the controlling voltage; $V_O$ represents the output voltage; VT3 represents a threshold voltage of the first transistor; VSS represents a voltage provided by the second voltage source; VD2 represents a forward voltage of a parasitic diode of the second power switch.

12. The dead-time detecting circuit of claim 9, wherein when the output-stage circuit enters the dead-time state and the inductive load discharges through the first voltage source, the relation between the output voltage and the second controlling voltage conforms to the second predetermined relation.

13. The dead-time detecting circuit of claim 9, wherein when the relation between the output voltage and the second controlling voltage conforms to the second predetermined relation, the first transistor outputs the second dead-time detecting signal representing turning on for turning on the first power switch so that the output-stage circuit leaves the dead-time state.

14. The dead-time detecting circuit of claim 13, wherein the second predetermined relation is:

$$VDD-VT4 < VG\_BIASP < VDD-VT4+VD1;\text{ and}$$

$$VSG4 \geq [VO-(VDD-VT4+VD1)];$$

wherein VO=VDD+VD1;

wherein VG_BIASP represents the second controlling voltage; VO represents the output voltage; VT4 represents a threshold voltage of the second transistor; VDD represents a voltage provided by the first voltage source, VD1 represents a forward voltage of a parasitic diode of the first power switch.

15. The dead-time detecting circuit of claim 9, wherein the first dead-time detector further comprises a first waveform trimmer, coupled to the second end of the first transistor, for trimming waveform of the first dead-time detecting signal; the second dead-time detector further comprises a second waveform trimmer, coupled to the second end of the second transistor, for trimming waveform of the second dead-time detecting signal;

wherein the first waveform trimmer comprises an inverter, and the second waveform trimmer comprises an inverter.

16. The dead-time detecting circuit of claim 9, further comprising a current-limiting resistor, coupled between the first end of the first transistor, the first end of the second transistor, and the output end of the output-stage circuit.

17. A modulation circuit for detecting dead-time, comprising:

an output-stage circuit, for providing an output signal to an inductive load;

a previous-stage circuit, coupled to the output-stage circuit, for providing a switch-driving signal to the output-stage circuit so as to control operation of the output-stage circuit; and a dead-time detecting circuit, coupled between the previous-stage circuit and the output-stage circuit, for detecting a dead-time of the output-stage circuit, the dead-time detecting circuit outputting a dead-time detecting signal to the previous-stage circuit according to a predetermined relation, the previous-stage circuit urging the output-stage circuit to leave a dead-time state according to the dead-time detecting signal;

wherein the dead-time detecting circuit comprises a first transistor and a first resistor, the first resistor coupled between a first voltage source and a second end of the first transistor, a first end of the first transistor coupled to the output end of the output-stage circuit for receiving an output voltage of the output-stage circuit, a control end of the dead-time detecting circuit controlling operation of the first transistor according to a controlling voltage, wherein when relation between output voltage and the controlling voltage conforms to the predetermined relation, the second end of the first transistor outputs a dead-time detecting signal representing turning on to the previous-stage circuit for the previous-stage circuit urging the output-stage circuit to leave the dead-time state.

18. The modulation circuit for detecting dead-time of claim 17, wherein the output-stage circuit comprises:

a first power switch, coupled between a first voltage source and the output end of the output-stage circuit; and a second power switch, coupled between a second voltage source and the output end of the output-stage circuit;

wherein when both the first power switch and the second power switch are turned off, the output-stage circuit enters the dead-time state;

wherein voltage level of the first voltage source is higher than voltage level of the second voltage source.

19. The modulation circuit for dead-time detecting circuit of claim 17, wherein the predetermined relation is:

$$(VSS+VT3) > VG\_BIASN > VT3+(VSS-VD2);\text{ and}$$

$$VGS3 \geq [VT3+(VSS-VD2)-VO];$$

wherein VO=VSS−VD2;

wherein VG_BIASN represents the controlling voltage; $V_O$ represents the output voltage; VT3 represents a threshold voltage of the first transistor; VSS represents voltage provided by the second voltage source; VD3 represents a forward voltage of a parasitic diode of the second power switch.

* * * * *